United States Patent [19]
Chow

[11] 4,068,219
[45] Jan. 10, 1978

[54] MAGNETIC DOMAIN BIAS FIELD ASSEMBLY

[75] Inventor: Ling George Chow, Oklahoma City, Okla.

[73] Assignee: Honeywell Information Systems, Inc., Waltham, Mass.

[21] Appl. No.: 550,783

[22] Filed: Feb. 18, 1975

[51] Int. Cl.² .............................................. G11C 19/08
[52] U.S. Cl. ........................................... 365/27; 365/1
[58] Field of Search ....... 340/174 TF, 174 S, 174 PM

[56] References Cited

U.S. PATENT DOCUMENTS

| | | | |
|---|---|---|---|
| 3,678,478 | 7/1972 | Copeland | 340/174 S |
| 3,702,991 | 11/1972 | Bate et al. | 340/174 TF |
| 3,742,471 | 6/1973 | Mikami | 340/174 S |
| 3,786,445 | 1/1974 | Ho et al. | 340/174 S |
| 3,806,899 | 4/1974 | Myer | 340/174 PM |
| 3,831,156 | 8/1974 | Myer | 340/174 PM |
| 3,864,671 | 2/1975 | Myer | 340/174 PM |
| 3,927,397 | 12/1975 | Chow et al. | 340/174 TF |
| 3,931,618 | 1/1976 | Lacey | 340/174 TF |
| 3,996,574 | 12/1976 | Bobeck et al. | 340/174 TF |

OTHER PUBLICATIONS

IEEE Transactions on Magnetics-vol. Mag-9, No. 3, Sept. 1973, pp. 429-433.
IBM Tech. Disc. Bull., "Magnetic Domain Device Package" by Bogholtz et al., vol. 15, No. 6, 11/72, pp. 2001, 2002.

Primary Examiner—James W. Moffitt
Attorney, Agent, or Firm—Nicholas Prasinos; George Grayson; William F. White

[57] ABSTRACT

An improved bias field assembly for reducing power losses in a magnetic domain memory device. A preferred embodiment employs rectangular permanent magnets positioned above and below a drive coil/substrates assembly. Ferrite shields of the same general size as the permanent magnets are interposed between the magnets and the drive coil/substrates assembly. These shields provide a highly resistive, relatively impermeable path for induced eddy currents and flux to reduce the effective resistance of the drive coil during high frequency operation and to minimize hysteresis losses.

13 Claims, 5 Drawing Figures

MAGNETIC DOMAIN BIAS FIELD ASSEMBLY

BACKGROUND OF THE INVENTION

The present invention relates to magnetic memory devices and more particularly to an improved bias field assembly for use in such devices.

Magnetic domains or bubbles are minute cylindrical areas that can be generated and maintained in thin films of magnetic material. These cylindrical areas, which are magnetized in the opposite direction from the rest of the thin film material, can be moved or propagated along Permalloy tracks on the film surface when subjected to a rotating magnetic field. Track arrangements for performing shift functions and logic operations are well known in the art.

Magnetic domains are maintained by a magnetic bias field produced by a bias field assembly which normally includes two permanent magnets having dissimilar magnetic charges and two magnetically permeable plates for distributing the magnetic charges. The magnetically permeable plates parallel the upper and lower surfaces of an assembly including substrates on which the magnetic domain films are mounted. These substrates are surrounded by a drive coil assembly which includes a pair of orthogonal coils which may be energized by high frequency alternating currents to establish a rotating magnetic field. It is this field which causes the magnetic domains to propagate along the Permalloy tracks on the film surface. Magnetic bias field apparatus of this kind is disclosed in U.S. Pat. No. 3,927,397, assigned to the assignee of the present application.

The rotating magnetic field induces eddy currents in the permeable plates above and below the drive coil/substrates assembly. The eddy currents increase the effective resistance of the drive coil, thereby increasing the power required to maintain a suitable magnetic field. Power losses create heat dissipation problems.

Power losses and heat dissipation requirements were not considered to be critical with prior art magnetic domain memory devices since such devices used smaller drive coils which operated at lower frequencies. Smaller drive coils operating at the lower frequencies did not induce unacceptable levels of eddy currents. However, magnetic domain memories have been increasing in size in order to increase memory capacities. Similarly, the frequencies of alternating currents used to energize drive field coils have been increased to raise propagation speeds and thus data transfer rates. Greater eddy currents and hysteresis losses have resulted leading, in turn, to severe power losses and heat dissipation requirements.

SUMMARY OF THE INVENTION

The present invention overcomes these problems by means of highly resistive, relatively impermeable shields.

A bias field assembly constructed in accordance with the invention has a first assembly which includes a first magnet means for generating a distributed magnetic charge. A first shield is contiguous to and generally coextensive with the planar area over which the magnetic charge is distributed. The bias field apparatus also includes a second assembly with a second magnet for generating a distributed magnetic charge of an opposite polarity. A second shield is contiguous and generally coextensive with the area over which the second magnetic charge is distributed. The apparatus also includes means for holding the first and second assemblies in generally parallel relationship.

DESCRIPTION OF THE DRAWINGS

While the specification concludes with claims particularly pointing out and distinctly claiming that which is regarded as the present invention, further details of preferred embodiments of the invention may be more readily ascertained from the following detailed description when read in conjunction with the accompanying drawings wherein:

DETAILED DESCRIPTION

Figure 1:
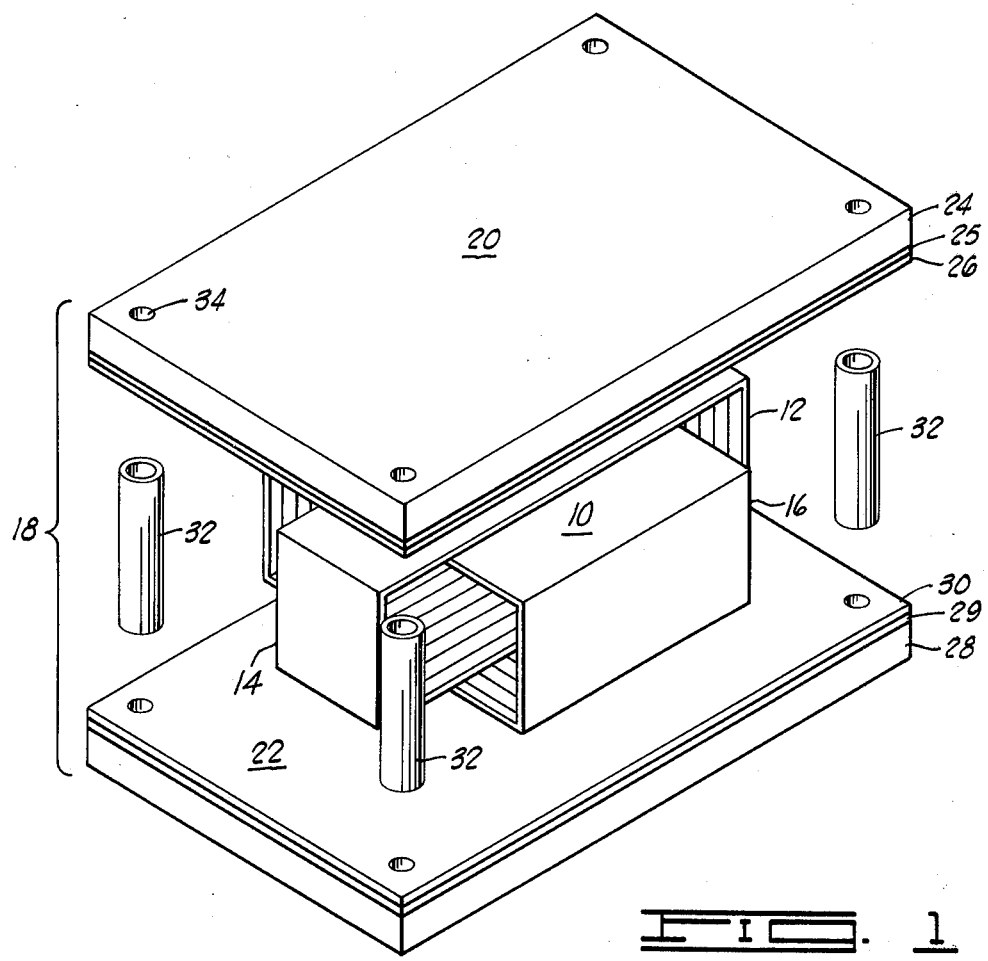
FIG. 1 is a perspective view of a magnetic domain memory including an improved bias field assembly.

Referring now to FIG. 1, a magnetic domain memory device 10 constructed in accordance with the present invention includes a drive coil/substrates assembly 12 having a pair of drive coils 14 and 16 orthogonal to one another. The drive coils 14 and 16 encompass one or more ceramic substrates, each of which carries a number of wafers of magnetic domain film. Magnetic circuits on these wafers are connected to input/output electronics through a number of electrical leads or conducting paths, none of which are shown. Many different types of drive coil/substrates assemblies have been developed in the prior art. The present invention would work equally well with many developed assemblies. Furthermore, since the details of a drive coil/substrates assembly are not essential to an understanding of the present invention, all such details are omitted.

The drive coil/substrates assembly 12 is encompased by a bias field apparatus 18 which, in a preferred embodiment includes a first magnet means 20 located above the drive coil/substrates assembly 12 and a second magnet means 22 located below assembly 12. The first magnet means 20 includes a permanently magnetized slab magnet 24 having dissimilar magnetic poles at opposite major surfaces. The magnetic charges at the surface of magnet 24 are normally distributed relatively uniformly over the length and width of the major surface. In a preferred embodiment of the invention, the uniformity or homogeneity of the distributed charges is enhanced by a plate 25 included within magnet means 20 and made from a highly permeable material such as Permalloy metal. The plate 25 is preferably the same length and width as the slab magnet 24 but is much thinner. As an example, slab magnet 24 might be 3½ inches wide, 6 inches long and 250 mils thick. Plate 25 might be as long and as wide but only 60 mils thick. A shield 26 of the same general length and width as magnet 24 and plate 25 is contiguous to plate 25. The shield 26 is made of a highly resistive, relatively impermeable material such as a ferrite material.

The second magnet means 22 similarly includes a permanently magnetized slab magnet 28 and a highly permeable plate 29 separated from the drive coil/substrates assembly 12 by a shield 30 made from the same type of material as the shield 26.

The first magnet means 20 and the second magnet means 22 are spaced generally parallel to one another by cylindrical spacers 32 secured to the magnet means by conventional fasteners such as bolts (not shown) inserted through openings 34 near the corners of the magnet means.

The shields 26 and 30 serve to reduce hysteresis losses and the magnitude of eddy currents generated upon enerization of the drive coils 14 and 16. The result is a lower effective drive coil resistance to alternating currents and, as a consequence, reduced power losses and heat dissipation requirements.

Figure 2:
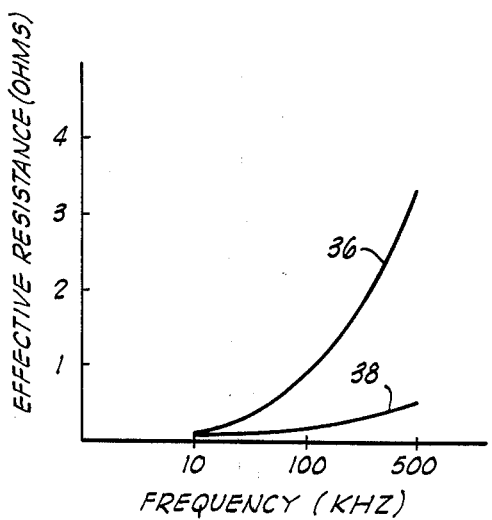
FIG. 2 is a chart of the effective resistance of the drive field coil at various operating frequencies for both an unshielded bias field assembly and a bias field assembly constructed in accordance with the present invention.
Figure 2:
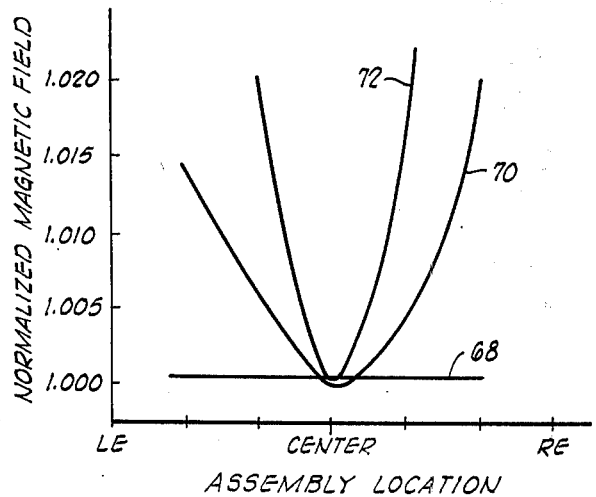
Figure 2:
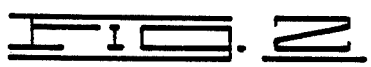

The shields have a significant effect on the effective resistance of the drive coils particularly at higher drive coil frequencies. This is shown in FIG. 2 where a sharply-increasing curve 36 represents the effective resistance of magnetic domain memory device lacking high resistivity shields at operating frequencies ranging from 10 to 500 kilohertz. A second, slowly increasing curve 38 shows the effective resistance of drive coils operating in the 10-500 kilohertz range when highly resistive shields are included in a bias field assembly in accordance with the present invention. At lower operating frequencies the effective resistance is about the same for both shielded and unshielded assemblies. However, as the operating frequencies increase, the differences in the effective resistances become greater until, at 500 kilohertz, the effective resistance of a drive coil in an unshielded assembly is roughly six times as great as the effective resistance of a drive coil in an assembly constructed in accordance with the present invention.

Figure 3:
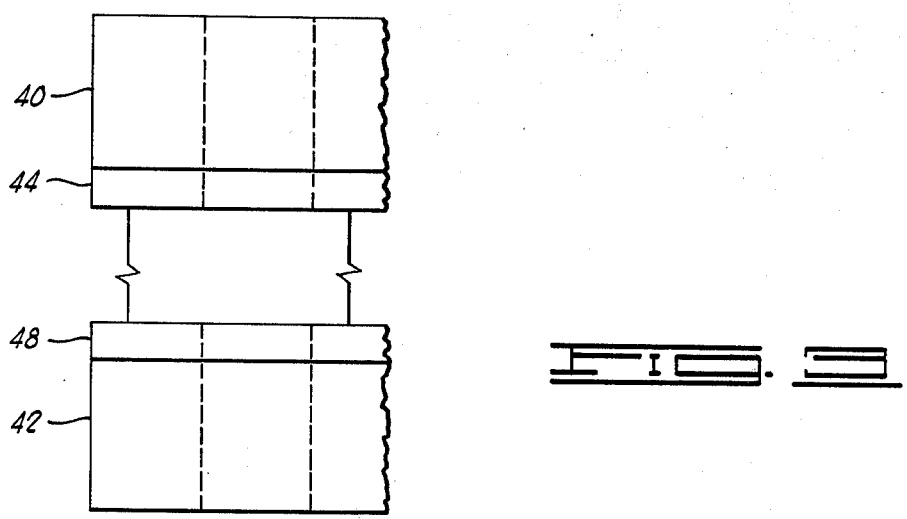
FIG. 3 is a partial view of an alternate embodiment of the invention.

While a preferred embodiment of the invention includes a slab magnet, a highly permeable plate and a highly resistive shield in a sandwich construction, an alternate embodiment of the invention depicted in FIG. 3 omits the highly permeable plates. The alternate embodiment includes first and second permanent slab magnets 40 and 42 of the same type as magnets 24 and 26. The slab magnets 40 and 42 are shielded from an interposed drive coil/substrates assembly (not shown) by highly resistive shields 44 and 48 of the same general length and width as the slab magnets.

Laboratory measurements have shown the bias field produced by the alternate embodiment shown in FIG. 3 is slightly less uniform than the bias field produced by the preferred embodiment of FIG. 1.

Figure 4:
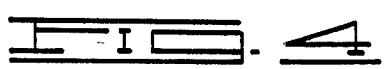
FIG. 4 is a graph of magnetic fields at various locations within the bias field assembly for a shielded assembly, and of two different types.

The effect of omitting the highly permeable plates is illustrated in FIG. 4. The straight line 68 represents the magnetic field within a shielded bias field assembly of the type shown in FIG. 1 measured at various points ranging from one inch in from the left edge (LE) of the assembly to one inch in from the right edge (RE) of the assembly. The roughly parabolic curve 70 represents the magnetic field distribution in a bias field assembly of the type shown in FIG. 3; that is, one lacking highly permeable plates. The expanded vertical scale of the chart exaggerates the change in field distribution. Inspection of the ordinate values shows the field strength varies by a maximum of two percent over the range of measurements. For some applications, the lower cost of the alternate embodiment may be more significant than any degradation in field uniformity.

Both the bias field assembly illustrated in FIG. 1 and the assembly illustrated in FIG. 3 produce fields more uniform than the fields produced by the widely used Watson magnet biasing configuration which, of necessity, includes highly permeable plates. Curve 72 illustrates the magnetic field distribution in a typical Watson magnet biasing configuration.

Figure 5:
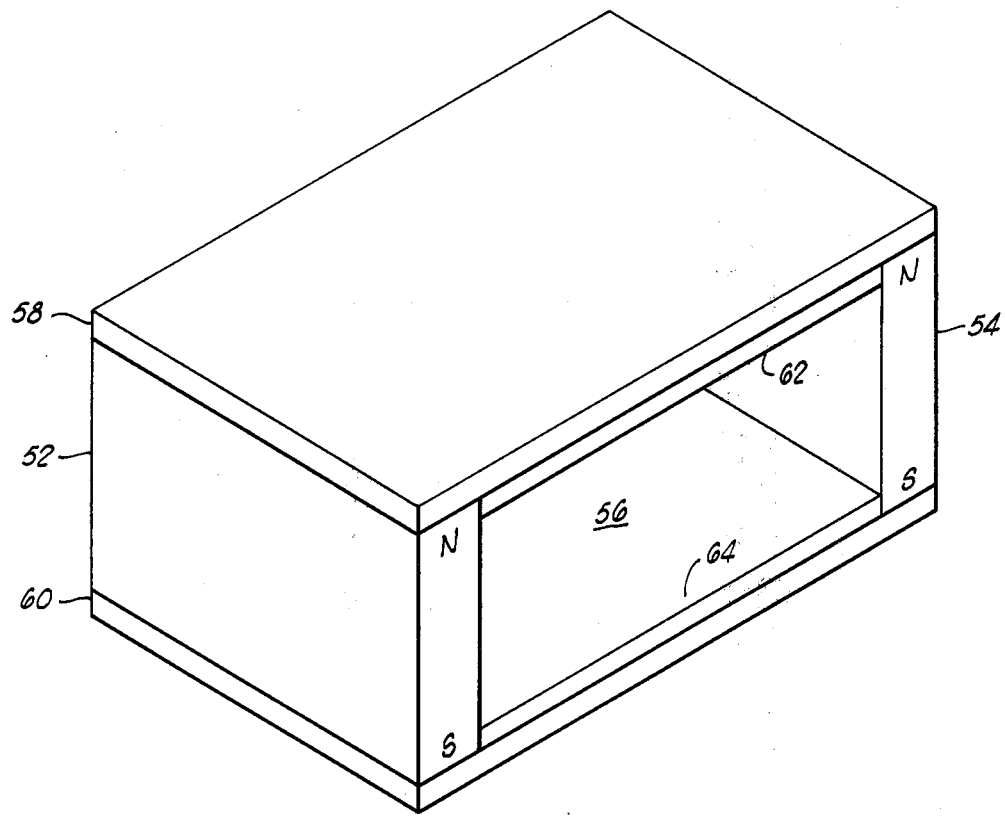
FIG. 5 is a partial view of another alternate embodiment of the invention.

While the present invention has been described with reference to a bias field apparatus consisting of parallel slab magnets, the invention may also be used to reduce power losses in the Watson magnet configuration. In a Watson magnet configuration, illustrated in FIG. 5, a pair of bar magnets 52 and 54 are positioned at opposite edges of a volume 56 having a drive coil/substrates assembly, not shown, to simplify the drawing. The upper edges of the bar magnets 52 and 54 have one magnetic charge; the lower edges have the opposite charges. While the upper edges are shown as North magnetic poles and the lower edges as South magnetic poles, the designation is arbitrary. The charges are distributed over the volume bounded by the magnets 52 and 54 by rectangular plates 58 and 60 made of a highly permeable material such as Permalloy material. The configuration described thus far is a conventional one.

To use the present invention in such a configuration, highly resistive shields 62 and 64 are added to the inner faces of the highly permeable plates 58 and 60. The shields 62 and 64 are generally coextensive with the upper and lower surfaces of the volume defined by magnets 52 and 54 and permeable plates 58 and 60.

While there have been described what are considered to be preferred embodiments of the present invention, various other modifications may occur to those skilled in the art once they become familiar with the invention. Therefore, it is intended that the appended claims shall be construed as including all such variations and modifications as would occur to one skilled in the art.

I claim:

1. An improved magnetic bias field apparatus said apparatus operating with high frequency driven orthogonal drive coil assemblies comprising:

a. a first assembly including
      i. a first magnet means for establishing a distributed magnetic charge in a first planar area,
      ii. a first magnetically permeable plate positioned contiguous with the first magnet and generally coextensive with the first planar area for enhancing the uniformity of the distributed magnetic charge in the first planar area, and
      iii. a first highly resistive, relatively impermeable shield positioned contiguous to and generally coextensive with the first planar area in such a manner as to minimize hysteresis and eddy current losses resulting in a reduction of the effective resistance of said high frequency orthogonal drive coils;
   b. a second assembly including
      i. a second magnet means establishing a distributed opposite magnetic charge in a second planar area,
      ii. a second magnetically permeable plate positioned contiguous with the second magnet and generally coextensive with the second planar area for enhancing the uniformity of the distributed magnetic charge in the second planar area, and
      iii. a second highly resistive, relatively impermeable shield positioned contiguous to and generally coextensive with the second planar area in such a manner as to minimize hysteresis and eddy current losses resulting in a reduction of the effective resistance of said high frequency orthogonal drive coils; and c. spacing means positioned between the first and second magnet means for holding said first and said second assemblies in generally parallel relationship with said first and said second shields.

2. An improved magnetic bias field apparatus as recited in claim 1 wherein:
said first magnet means comprises a first bar magnet extending along one edge of a volume bound by said first and said second assemblies;
said second magnet means comprises a second bar magnet extending along an edge of the volume opposite the one edge; and
said first and said second magnetically permeable plates being parallel to and separated by the interposed shields.

3. An improved bias field apparatus as recited in claim 1 wherein said first and said second magnet means are made of permanently magnetized materials.

4. An improved magnetic bias field apparatus as recited in claim 1 wherein each said magnet means includes a slab magnet having a major surface covering the planar area said magnet means being adjacent the magnetically permeable plate of the assembly, wherein the high frequency drive coils operate in excess of 100 kilohertz.

5. An improved magnetic bias field apparatus as recited in claim 4 wherein the shields are made of a ferrite material.

6. An improved magnetic bias field apparatus as recited in claim 1 wherein the shields are made of a ferrite material.

7. An improved bias field apparatus as recited in claim 6 wherein said first and said second magnet means are made of permanently magnetized materials.

8. For use in a magnetic domain memory device including domain material wafers mounted on substrates and a high frequency orthogonal drive coil assembly surrounding the substrates, an improved bias field apparatus for reducing power losses comprising:
a. an upper assembly including
  i. a first permanent magnet having dissimilar magnetic charges at opposite major surfaces,
  ii. a first mangetically permeable plate continguous with one major surface of said first permanent magnet, and
  iii. a first highly resistive, relatively impermeable shield contiguous with one major surface of said first magnetically permeable plate in such a manner as to minimize hysteresis and eddy current losses resulting in a reduction of the effective resistance of said high frequency orthogonal drive coils;
b. a lower assembly including
  i. a second permanent magnet having dissimilar magnetic charges at opposite major surfaces,
  ii. a second magnetically permeable plate contiguous with one major surface of said first permanent magnet, and
  iii. a second highly resistive, relatively impermeable shield contiguous with one major surface of said second magnetically permeable plate in such a manner as to minimize hysteresis and eddy current losses resulting in a reduction of the effective resistance of said high frequency orthogonal drive coils; and
c. spacing means for holding said upper assembly and said lower assembly in generally parallel relationship on opposite sides of the drive coil assembly with each shield being between the drive coil assembly and one of the permanent magnets.

9. An improved bias field apparatus as recited in claim 8 wherein the shields are made of a ferrite material.

10. An improved bias field apparatus as recited in claim 9 wherein each magnetically permeable plate is made from Permalloy material.

11. For use in a magnetic domain memory device including domain material wafers mounted on substrates and a high frequency orthogonal drive coil assembly surrounding the substrates, an improved bias field apparatus for reducing power losses comprising:
a. a first bar magnet on one side of said drive coil assembly;
b. a second bar magnet on the opposite side of said drive coil assembly;
c. a first highly permeable plate bridging said first and second bar magnets above said drive coil assembly;
d. a second highly permeable plate bridging said first and second bar magnets below said drive coil assembly;
e. a first highly resistive, relatively impermeable shield located between said first highly permeable plate and the upper surface of said drive coil assembly in such a manner as to minimize hysteresis and eddy current losses resulting in a reduction of the effective resistance of said high frequency orthogonal drive coils; and
f. a second highly resistive, relatively impermeable shield located between said second highly permeable plate and the lower surface of said drive coil assembly in such a manner as to minimize hysteresis and eddy current losses resulting in a reduction of the effective resistance of said high frequency orthogonal drive coils.

12. An improved bias field apparatus as recited in claim 11 wherein said shields are made of a ferrite material.

13. An improved bias field apparatus as recited in claim 12 wherein said plates are made of a Permalloy material.

* * * * *